United States Patent
Lille

(10) Patent No.: US 8,300,366 B2
(45) Date of Patent: Oct. 30, 2012

(54) MAGNETIC STORAGE DEVICE WHICH INCLUDES A THREE TERMINAL MAGNETIC SENSOR HAVING A COLLECTOR REGION ELECTRICALLY ISOLATED FROM A SLIDER BODY

(75) Inventor: Jeffrey S. Lille, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 917 days.

(21) Appl. No.: 11/900,537

(22) Filed: Sep. 12, 2007

(65) Prior Publication Data
US 2008/0007876 A1 Jan. 10, 2008

Related U.S. Application Data

(62) Division of application No. 11/125,648, filed on May 10, 2005, now Pat. No. 7,719,069.

(51) Int. Cl.
G11B 5/33 (2006.01)
(52) U.S. Cl. ........................................ 360/313
(58) Field of Classification Search ................... 360/313
See application file for complete search history.

(56) References Cited

U.S. PATENT DOCUMENTS

| | | | |
|---|---|---|---|
| 5,528,067 A * | 6/1996 | Farb | 257/401 |
| 6,069,820 A | 5/2000 | Inomata | |
| 6,131,271 A | 10/2000 | Fontana, Jr. | |
| 6,134,090 A | 10/2000 | Mao | |
| 6,577,476 B1 | 6/2003 | Childress | |
| 6,809,959 B2 | 10/2004 | Johnson | |
| 2003/0123335 A1 | 7/2003 | Rettner | |
| 2004/0100739 A1 | 5/2004 | Gill | |
| 2004/0105195 A1 | 6/2004 | Fontana, Jr. | |
| 2004/0136120 A1 | 7/2004 | Hayakawa | |

* cited by examiner

*Primary Examiner* — David D Davis
(74) *Attorney, Agent, or Firm* — John J. Oskorep, Esq.; Darren Gold

(57) ABSTRACT

In one illustrative example, a magnetic storage device includes a three terminal magnetic sensor having a collector region made of a semiconductor material, a base region, and an emitter region. An insulator layer is formed between the collector region and a slider body which carries the three terminal magnetic sensor. The insulator layer serves to reduce a capacitance otherwise present between the collector region and magnetic media at a magnetic field sensing plane of the three terminal magnetic sensor. Thus, the insulator layer electrically isolates the collector region from the slider body. The structure may be formed through use of a separation by implanting oxygen (SIMOX) technique or a wafer-bonding technique, as examples.

10 Claims, 5 Drawing Sheets

MAGNETIC STORAGE DEVICE WHICH INCLUDES A THREE TERMINAL MAGNETIC SENSOR HAVING A COLLECTOR REGION ELECTRICALLY ISOLATED FROM A SLIDER BODY

CROSS-REFERENCE TO RELATED APPLICATION

The present application is a divisional of and claims priority to a U.S. patent application entitled "Three Terminal Magnetic Sensor Having A Collector Region Electrically Isolated From A Carrier Substrate Body" having application Ser. No. 11/125,648 and a filing date of 10 May 2005, now U.S. Pat. No. 7,719,069 which is hereby incorporated herein by reference.

BACKGROUND

1. Field of the Technology

This present invention relates generally to magnetic storage devices having three terminal magnetic sensors (TTMs) suitable for use in magnetic heads, including spin valve transistors (SVTs), magnetic tunnel transistors (MTTs), or double junction structures.

2. Description of the Related Art

Magnetoresistive (MR) sensors have typically been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external field from the recorded magnetic medium (the signal field) causes a change in the direction of magnetization in the read element, which causes a change in resistance of the read element and a resulting change in the sensed current or voltage.

A three terminal magnetic sensor (TTM) of a magnetic head may comprise a spin valve transistor (SVT), for example, which is a vertical spin injection device having electrons injected over a barrier layer into a free layer. The electrons undergo spin-dependent scattering, and those that are only weakly scattered retain sufficient energy to traverse a second barrier. The current over the second barrier is referred to as the magneto-current. Conventional SVTs are constructed using a traditional three-terminal framework having an "emitter-base-collector" structure of a bipolar transistor. SVTs further include a spin valve (SV) on a metallic base region, whereby the collector current is controlled by the magnetic state of the base region using spin-dependent scattering. Although the TTM may involve an SVT where both barrier layers are Schottky barriers, the TTM may alternatively incorporate a magnetic tunnel transistor (MTT) where one of the barrier layers is a Schottky barrier and the other barrier layer is a tunnel barrier, or a double junction structure where both barrier layers are tunnel barriers.

The revolution in magnetic storage technology has been led by miniaturization of every component in the system, especially the mechanical fly height. A slider may provide a fly height of less than 10 nanometers, for example. In the prior art, the collector region of a TTM is typically formed as part of a slider body of the hard disk drive. Even though the slider body may be very small, the slider body is much larger than that needed as the collector region for TTM operation.

Based on these relative dimensions, it has been identified that an inherent capacitance between the magnetic media and the collector region/slider body for such small sliders (e.g. Femto sliders) is very large in light of a typical operating frequency of the hard disk drive. For example, the capacitance may be about 18 picofarads (pF) for typical operating frequencies of the hard disk drive of about 1 Gigahertz (Ghz). Such a large capacitance will unnecessarily reduce the signal from the magnetic media and introduce unnecessary noise into the circuit.

Accordingly, there is a need to solve these problems so that TTMs may be suitable for use in these and other devices.

SUMMARY

In one illustrative example, a magnetic storage device has a three terminal magnetic sensor which includes a collector region made of a semiconductor material, a base region, and an emitter region. An insulator layer is formed between the collector region and a slider body which carries the three terminal magnetic sensor. The insulator layer serves to reduce a capacitance between the collector region and magnetic media at a magnetic field sensing plane of the three terminal magnetic sensor. Thus, the insulator layer electrically isolates the collector region from the slider body. The structure may be formed through use of a separation by implanting oxygen (SIMOX) technique or a wafer-bonding technique, as examples.

BRIEF DESCRIPTION OF THE DRAWINGS

Other objects and advantages of the invention will become more apparent to those skilled in the art after considering the following detailed description in connection with the accompanying drawings.

DETAILED DESCRIPTION OF THE PREFERRED EMBODIMENTS

In one illustrative example, a magnetic storage device has a three terminal magnetic sensor which includes a collector region made of a semiconductor material, a base region, and an emitter region. An insulator layer is formed between the collector region and a slider body which carries the three terminal magnetic sensor. The insulator layer serves to reduce a capacitance between the collector region and magnetic media at a magnetic field sensing plane of the three terminal magnetic sensor. Thus, the insulator layer electrically isolates the collector region from the slider body. The structure may be formed through use of a separation by implanting oxygen (SIMOX) technique or a wafer-bonding technique, as examples.

The following description is the best embodiment presently contemplated for carrying out the present invention. This description is made for the purpose of illustrating the general principles of the present invention and is not meant to limit the inventive concepts claimed herein.

Figure 1:
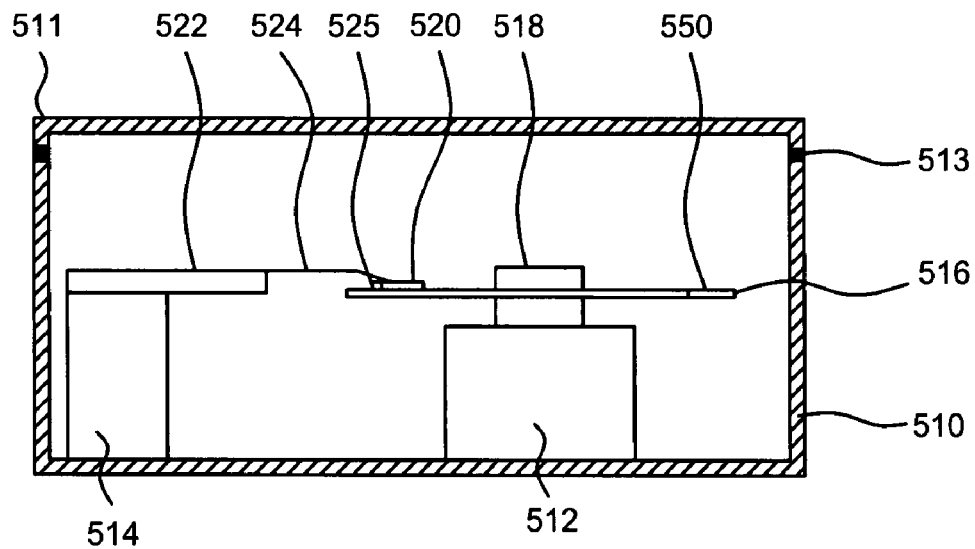
FIG. 1 is a cross-sectional view of a disk drive which may embody a magnetic head having a three terminal magnetic sensor (TTM) such as a spin valve transistor (SVT)
Figure 2:
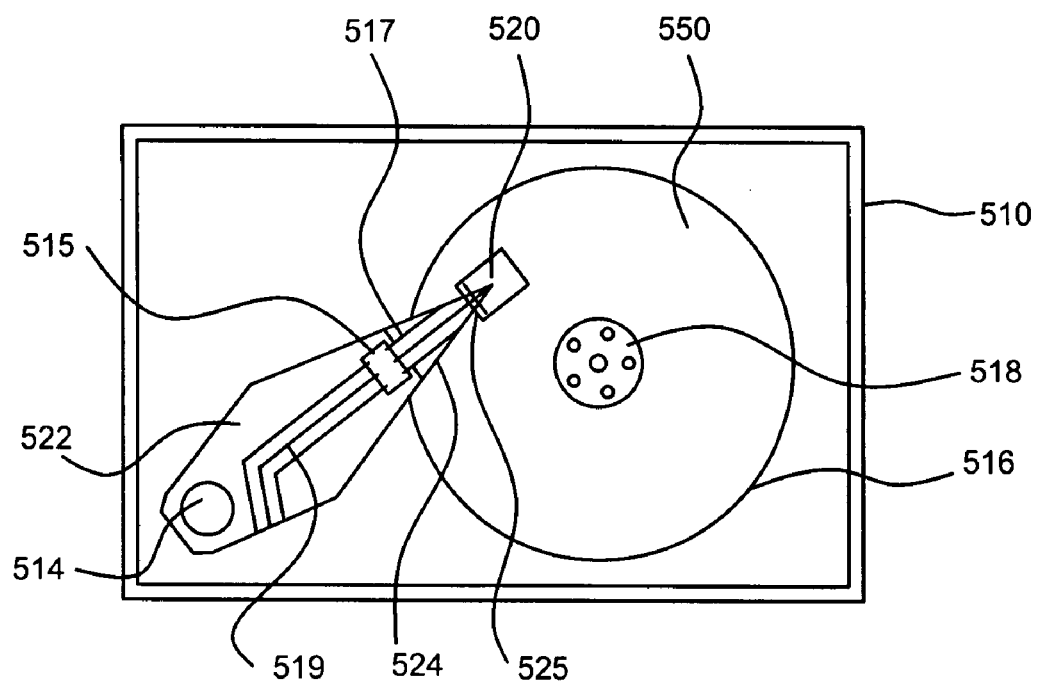
FIG. 2 is a top-down view of the disk drive of FIG. 1.

FIG. 1 is a simplified block diagram of a conventional magnetic recording disk drive for use with a three terminal magnetic sensor (TTM) of a magnetic head. FIG. 2 is a top view of the disk drive of FIG. 1 with the cover removed. Referring first to FIG. 1, there is illustrated in a sectional view a schematic of a conventional disk drive of the type using a TTM. The disk drive comprises a base 510 to which are secured a disk drive motor 512 and an actuator 514, and a cover 511. Base 510 and cover 511 provide a substantially sealed housing for the disk drive. Typically, there is a gasket 513 located between base 510 and cover 511 and a small breather port (not shown) for equalizing pressure between the interior of the disk drive and the outside environment. A magnetic recording disk 516 is connected to drive motor 512 by means of a hub 518 to which it is attached for rotation by drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a read head portion. Slider 520 is connected to actuator 514 by means of a rigid arm 522 and a suspension 524. Suspension 524 provides a biasing force which urges slider 520 onto the surface of the recording disk 516. During operation of the disk drive, drive motor 512 rotates disk 516 at a constant speed, and actuator 514, which is typically a linear or rotary voice coil motor (VCM), moves slider 520 generally radially across the surface of disk 516 so that read/write head 525 may access different data tracks on disk 516.

FIG. 2 illustrates in better detail suspension 524 which provides a force to slider 520 to urge it toward disk 516. Suspension 524 may be a conventional type of suspension, such as the well-known Watrous suspension, as described in U.S. Pat. No. 4,167,765. This type of suspension also provides a gimbaled attachment of the slider which allows the slider to pitch and roll as it rides on the air bearing surface. The data detected from disk 516 by transducer 525 is processed into a data readback signal by signal amplification and processing circuitry in an integrated circuit chip 515 located on arm 522. The signals from transducer 525 travel via a flex cable 517 to chip 515, which sends its output signals to the disk drive electronics (not shown) via cable 519.

Figure 3:
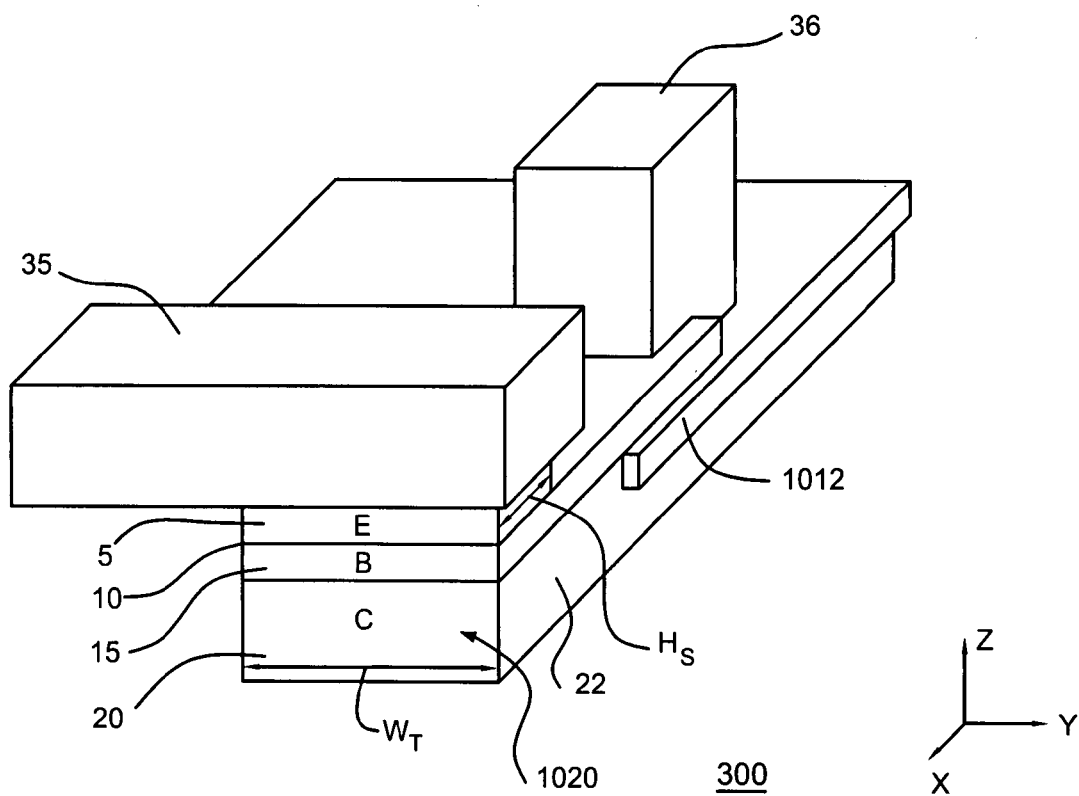
FIG. 3 is a perspective view of a typical TTM which has a collector region formed as part of a carrier substrate body.

In FIG. 3, a conventional three terminal magnetic sensor (TTM) 400 of the spin valve transistor (SVT) type is shown. Although described as incorporating an SVT (where both barrier layers are Schottky barriers), the TTM may alternatively incorporate a magnetic tunnel transistor (MTT) (where one of the barrier layers is a Schottky barrier and the other barrier layer is a tunnel barrier), or a double junction structure (where both barrier layers are tunnel barriers).

TTM 300 of FIG. 3 has a base region 15, a collector region 20 which is adjacent base region 15, an emitter region 5, and a barrier region 10 which separates emitter region 5 from base region 15. Collector region 20 may be a semiconductor substrate made of silicon (Si) or other suitable material. Collector region 20 is formed as part of a slider body 22 (which is one type of carrier substrate body) of the disk drive. Base region 15 preferably includes at least one soft ferromagnetic (FM) material, such as nickel-iron (NiFe), cobalt-iron (CoFe), or cobalt (Co), as well as a very thin metal (e.g. gold) which is sandwiched in between the FM materials. Barrier layer 10 is a non-magnetic insulating material, preferably made of aluminum-oxide, which is generally less than 10 Angstroms (Å) in thickness.

As indicated in FIG. 3, a trackwidth $W_T$ of the magnetic head is defined by the dimension of emitter region 5, base region 15, and collector region 20 along the y-axis, while a stripe height Hs of the magnetic head is defined by the dimension of emitter region 5 along the x-axis. A sensing plane 1020 of TTM 300 is defined along sides of base region 15, collector region 20, and emitter region 5. This sensing plane 1020 is at an air bearing surface (ABS) when TTM 300 is embodied in a magnetic head.

A non-magnetic insulator layer 1012 is offset behind sensing plane 1020 and adjacent collector region 20 and base region 15. Insulator layer 1012 may be, for example, an oxide material such as alumina. An emitter lead 35, which may be embodied as a ferromagnetic (FM) shield for TTM 300, is positioned in contact with emitter region 5 at sensing plane 1020. Emitter lead 35 serves as the electrical connection for emitter region 5 to an external lead (not visible in FIG. 3). A base lead 36 is positioned in contact with base region 15 behind sensing plane 1020. Base lead 36 and a collector lead (not visible in FIG. 3) are preferably not formed along sensing plane 1020. Note that additional or alternative leads may be formed in the TTM, which has at least three leads.

TTM 300 allows hot electrons emitted from emitter region 5 to travel through to base region 15 to reach collector region 20, which collects the magnetocurrent (i.e. collects the electrons). In operation, the device acts as a hot spin electron filter whereby barrier region 10 between emitter region 5 and base region 15 operates to selectively allow the hot electrons to pass on through to base region 15 and then on through collector region 20. When TTM 300 is not functioning, the device is in a known quiescent state. In this case, the magnetization of the free layer which comprises all or part of base region 15 is parallel to the ABS plane. The direction of this magnetization depends on the direction of the magnetic field produced by a pinned layer (not visible) formed adjacent the free layer. The scattering of electrons within the free layer is dependent upon the orientation of the magnetization within the free layer. For example, if the magnetization is pointing in the parallel direction relative to the pinned layer (i.e. parallel to the ABS plane), then the electrons are not scattered as much as compared to the case where the free layer is antiparallel relative to the pinned layer. The performance of the device may be different depending upon the relative configuration of emitter region 5, the free layer, and the hard bias layer.

Figure 4:
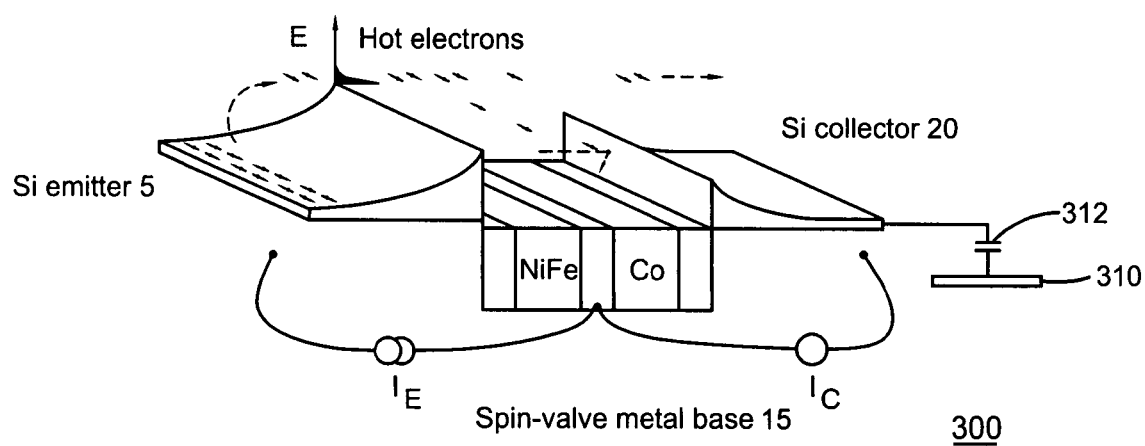
FIG. 4 is a partial schematic representation of the TTM of FIG. 3, where a relatively large capacitance exists between the collector region and magnetic media.

To further illustrate operation, FIG. 4 is provided to show a partial schematic representation of the TTM 300 (e.g. an SVT) of FIG. 3. The semiconductors and magnetic materials used in TTM 300 may include an n-type silicon (Si) material for emitter 5 and collector 20, and a $Ni_{80}Fe_{20}/Au/Co$ spin valve for base region 15. Energy barriers, also referred to as Schottky barriers, are formed at the junctions between metal base 15 and the semiconductors. It is desirable to obtain a high quality energy barrier at these junctions with good rectifying behavior. Therefore, thin layers of materials (e.g. platinum and gold) are oftentimes used at the emitter 5 and collector 20, respectively. Moreover, these thin layers separate the magnetic layers from the semiconductor materials.

A TTM operates when current is introduced between emitter region 5 and base region 15, denoted as $I_E$ in FIG. 4. This occurs when electrons are injected over the energy barrier and into base region 15 by biasing the emitter such that the electrons are traveling perpendicular to the layers of the spin valve. Because the electrons are injected over the energy barrier, they enter base region 15 as non-equilibrium hot electrons, whereby the hot-electron energy is typically in the range of 0.5 and 1.0 eV depending upon the selection of the metal/semiconductor combination. The energy and momentum distribution of the hot electrons change as the electrons move through base region 15 and are subjected to inelastic and elastic scattering. As such, electrons are prevented from entering collector region 20 if their energy is insufficient to overcome the energy barrier at the collector side. Moreover, the hot-electron momentum must match with the available states in the collector semiconductor to allow for the electrons to enter collector region 20. The collector current $I_C$, which indicates the fraction of electrons collected in collector region 20, is dependent upon the scattering in base region 15 which is spin-dependent when base region 15 contains magnetic materials. Furthermore, an external applied magnetic field controls the total scattering rate which may, for example, change the relative magnetic alignment of the two ferromagnetic layers of the spin valve. The magnetocurrent (MC), which is the magnetic response of the TTM, can be represented by the change in collector current normalized to the minimum value as provided by the following formula: MC= $[I^P_C - I^{AP}_C]/I^{AP}_C$, where P and AP indicate the parallel and antiparallel state of the spin valve, respectively.

The revolution in magnetic storage technology has been led by miniaturization of every component in the system, including the slider body. For example, sliders have been reduced in size to Nano sliders (early 1990's), to Pico sliders (1997), and to Femto sliders (2003) which represents the current state of the art. Typical dimensions of a Femto slider may be 700 µm (width)×230 µm (height)×850 µm (depth). When the size of the slider is reduced, its "fly height" is accordingly reduced. A Femto slider may have a fly height of about 3 nanometers, for example.

As shown in FIG. 3, collector region 20 is formed as part of slider body 22. Even though slider body 22 may be very small (e.g. less than 1 mm³), slider body 22 is much larger than that needed as collector region 20 for TTM operation. Based on these relative dimensions, it has been identified that an inherent capacitance 312 (see FIG. 4) between magnetic media 310 and collector region 20 for such small sliders (e.g. Femto sliders) is very large in view of a typical operating frequency of the disk drive. For example, the capacitance may be about 18 picofarads (pF) for typical operating frequencies of the hard disk drive of about 1 Gigahertz (Ghz). Such a large capacitance 312 will unnecessarily reduce the signal from the magnetic media 310 and introduce unnecessary noise into the circuit.

Figure 5:
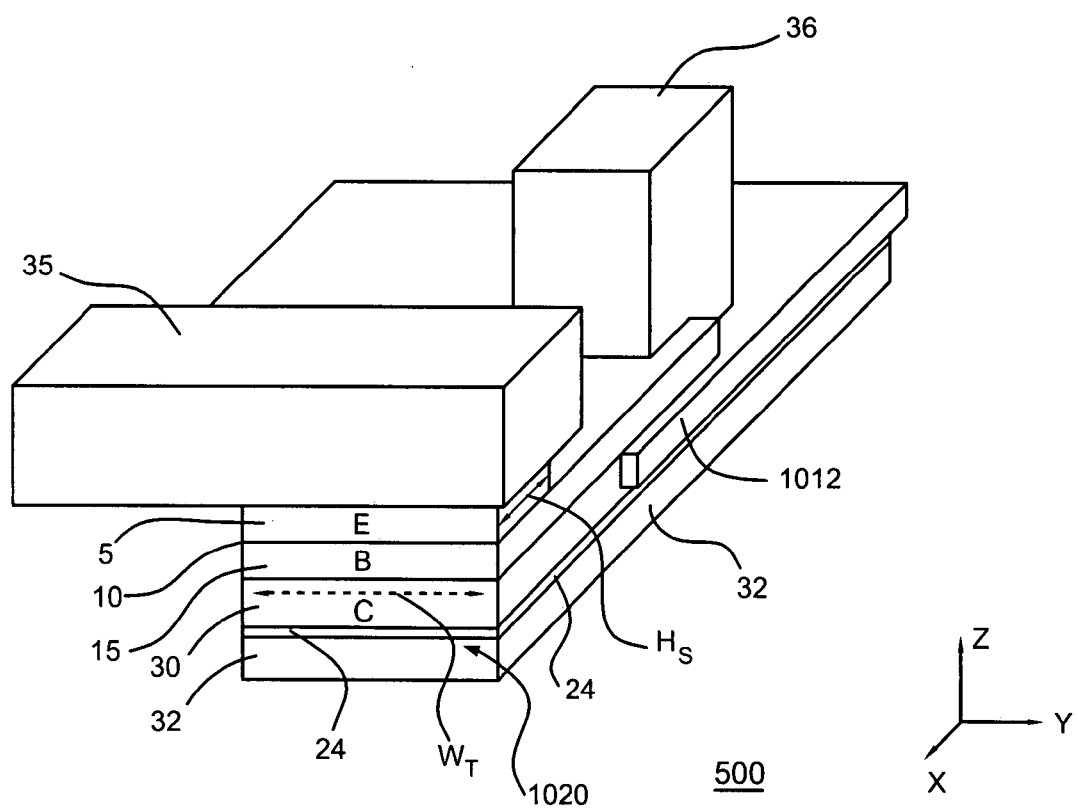
FIG. 5 is a perspective view of a TTM of the present application, which has an insulator layer formed between its collector region and the carrier substrate body so as to reduce the capacitance between the collector region and the magnetic media.

FIG. 5 is a perspective view of a three terminal magnetic sensor (TTM) device 500 of the present application. TTM device 500 is the same as that shown and described in relation to FIGS. 3-4, except that it does not exhibit the problems associated therewith due to structural modifications which will now be described.

To eliminate or mitigate the problem of existing TTMs, TTM device 500 has an insulator layer 24 formed between its collector region 30 and its slider body 32. Insulator layer 24 serves to electrically isolate slider body 32 from collector region 30, to thereby reduce or effectively eliminate the large capacitance (e.g. capacitance 312 of FIG. 4) otherwise present between collector region 30 and the magnetic media. Slider body 32 still serves as a substrate to carry TTM device 500 for magnetic storage purposes.

Preferably, slider body 32 is made of the same materials as collector region 30. These materials are preferably semiconductor materials, which may be or include silicon (Si) materials. Alternatively, slider body 32 and collector region 30 are made from materials different from each other. Insulator layer 24 may be made of any suitable electrically insulating materials, such as an oxide. For example, insulator layer 24 may be made from aluminum-oxide (alumina or $Al_2O_3$) or silicon dioxide ($SiO_2$).

The thicknesses of the materials and regions may vary depending on the design requirements, the size of the TTM, and the size of the slider body. In one embodiment, slider body 32 is a Femto slider, TTM 500 has trackwidth dimensions between 10 nm and 100 nm, and the fly height is between about 1 nm and 10 nm. In this case, insulator layer 24 is formed with a thickness of between about 10 nm and 10,000 nm, and collector region 30 is formed with a thickness of between about 1 nm and 1000 nm.

Thus, the TTM device 500 of the present application includes collector region 30 made of a semiconductor material, base region 15, and emitter region 5. Insulator layer 24 is formed between collector region 30 and slider body 32 which carries the TTM device 500, which electrically isolates collector region 30 from slider body 32. This reduces or effectively eliminates a capacitance between collector region 30 and magnetic media, so that magnetic signals may be adequately sensed from the magnetic media at the appropriate operating frequencies (e.g. 1 Gigahertz or greater).

There are several conventional processes utilized for fabricating such TTMs. These processes typically employ lithography, planarization, RIE etching, and other well-known techniques. Preferably, the TTM device structures of the present application are formed through the further use of a "separation by implanting oxygen" (SIMOX) technique. Alternatively, the TTM device structures of the present application are formed through the further use of a wafer-bonding technique. General SIMOX and wafer-bonding techniques are known in the field of semiconductor fabrication, but are specifically utilized and tailored herein to achieve the desired structural and functional results.

Figure 6:
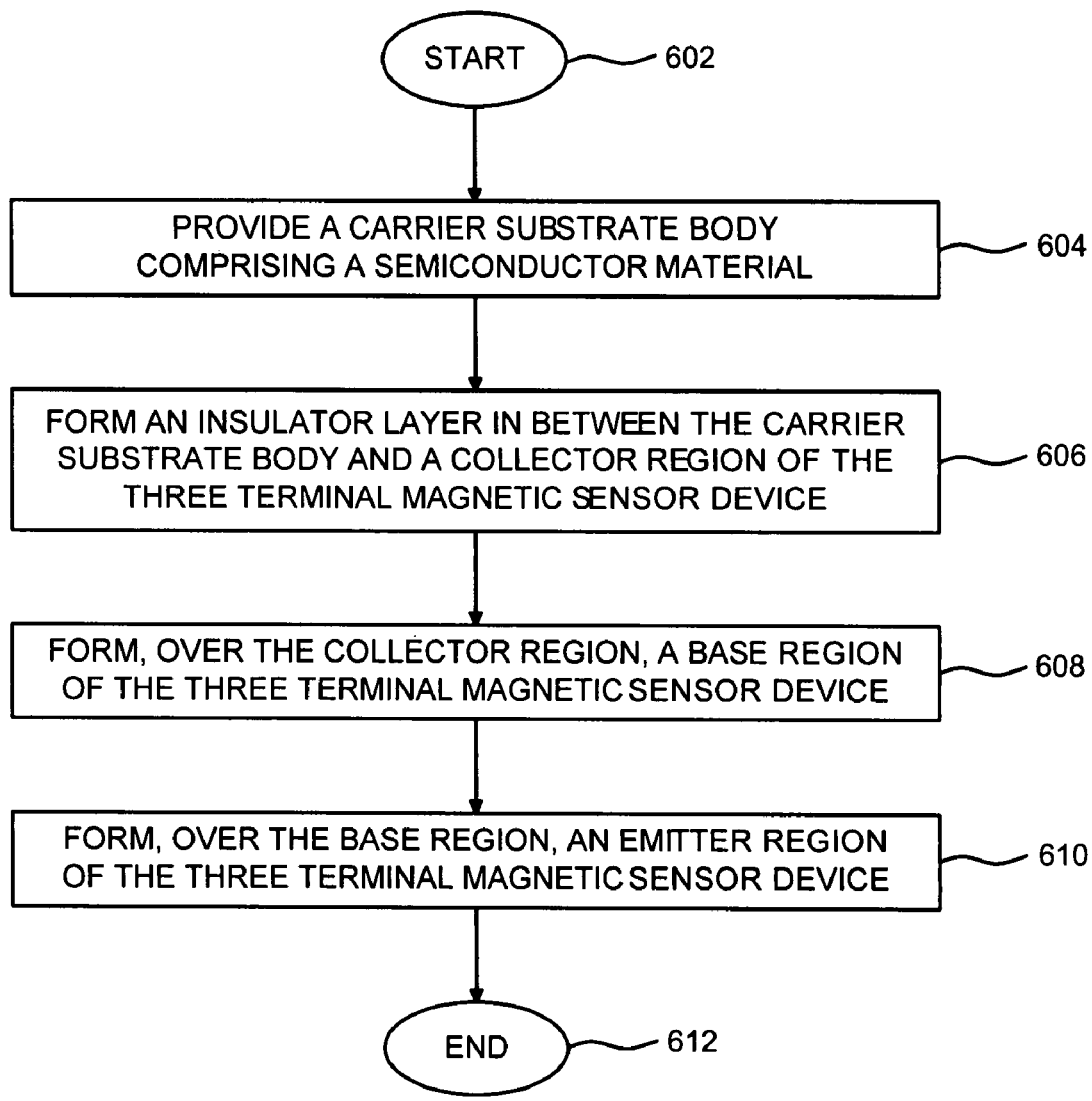
FIG. 6 is a flowchart which describes a method of forming the TTM of the present application.

FIG. 6 is a flowchart which describes a general method of forming TTM device 500 of the present application. Beginning at a start block 602 of FIG. 6, a carrier substrate body comprising a semiconductor material is provided (step 604 of FIG. 6). Next, an insulator layer is formed in between the carrier substrate body and a collector region of the TTM device (step 606 of FIG. 6). A base region of the TTM device is then formed over the collector region of the TTM device (step 608 of FIG. 6). An emitter region is then formed over the base region of the TTM device (step 610 of FIG. 6). The method corresponding to the steps described in the flowchart of FIG. 6 ends at an end block 612, but additional processing steps may be subsequently performed to complete the manufacture of the TTM device.

With use of the SIMOX technique, in particular, a slider body made of semiconductor material (e.g. silicon) is first provided. A high dose of oxygen ions are implanted into the slider body over a top surface which will later form part of the collector region. The implant energy, which may be between about 150-300 keV, serves to locate a peak of the oxygen-implantation beneath the top surface. The dose of oxygen ions may be on the order of $2 \times 10^{18}$/cm². The slider body is then annealed. The annealing process may, for example, be performed in $N_2$ for 3-5 hours at a high temperature (e.g. 1300-1350° C.). The annealing process forms a continuous buried-oxide (BOX) layer within the slider body with the collector region being formed above this BOX layer. The thickness of the collector region may be varied by subsequently depositing an epitaxial silicon layer or by etching. Note that nitrogen may be used in place of oxygen for this method.

With use of the wafer-bonding technique, in particular, two wafers made of a semiconductor material (e.g. silicon) are first provided. A surface portion of at least one of the wafers is oxidized. The two wafers are then positioned together and thermally bonded with the oxidized portion of the one wafer facing the other wafer. The bonding temperature may vary between about 400° C.-1200° C. The oxidized portion forms the insulator layer between the slider body and the collector region. It is preferred that the bonding or wafer insulation occurs before device fabrication due to the high thermal budget of SOI-like wafers. The thermal budget for most magnetic sensors is below 400° C. To prepare for the bonding, the wafers may be rinsed (e.g. with water) under a low speed rotation and then dried with a heat lamp under a high speed rotation. After the bonding, the wafer unit may be thinned through a thinning process and/or a splitting process. In one splitting process technique, a high dose of oxygen ions are implanted into the oxidized wafer, the depth of which defines the split which occurs during a post-bonding annealing process. Thus, at least part of one of the wafers is utilized as the slider body and at least part of the other wafer is utilized as the collector region. Using the wafer-bonding technique, insulator layers of greater thickness than that achieved through use of the SIMOX technique are possible.

Regardless of which technique is utilized, after the slider body is formed with the insulator layer between it and the collector region, a sensor stack structure is then formed. The sensor stack structure includes at least a base region which is formed below an emitter region. Thus, the further steps of the method include forming, over the collector region, a base region of the three terminal magnetic sensor device; and forming, over the base region, an emitter region of the three terminal magnetic sensor device. These may be formed using typical deposition and lithography techniques known in the art.

Final Comments. As described herein, a three terminal magnetic sensor includes a collector region made of a semiconductor material, a base region, and an emitter region. An insulator layer is formed between the collector region and a carrier substrate body which carries the three terminal magnetic sensor. The insulator layer serves to reduce a capacitance between the collector region and magnetic media at a magnetic field sensing plane of the three terminal magnetic sensor. Thus, the insulator layer electrically isolates the collector region from the carrier substrate body. The base region and the emitter region may be similarly isolated. The structure may be formed through use of a separation by implanting oxygen (SIMOX) technique or a wafer-bonding technique, as examples.

A magnetic storage device of the present application includes a slider body, a magnetic head carried on the slider body, and a read head portion of the magnetic head which includes a three terminal magnetic sensor for reading magnetic signals from magnetic media at a magnetic field sensing plane. The three terminal magnetic sensor includes a collector region made of a semiconductor material, a base region, and an emitter region. An insulator layer is formed between the collector region and the slider body so as to reduce a capacitance between the collector region and magnetic media at an air bearing surface (ABS) of the magnetic head. Thus, the insulator layer electrically isolates the collector region from the slider body.

A method of forming a three terminal magnetic sensor device of the present application includes the steps of providing a carrier substrate body comprising a semiconductor material; forming an insulator layer in between the carrier substrate body and a collector region of the three terminal magnetic sensor device; forming, over the collector region, a base region of the three terminal magnetic sensor device; and forming, over the base region, an emitter region of the three terminal magnetic sensor device. The act of forming the insulator layer in between the carrier substrate body and the collector region may comprise the further acts of performing an oxygen or nitrogen ion implantation over a surface of the carrier substrate body and then annealing the carrier substrate body. Thus, the act of forming the insulator layer in between the carrier substrate body and the collector region may comprise a separation by implanting oxygen (SIMOX) technique where the insulator layer comprises a continuous buried-oxide (BOX) layer within the carrier substrate body. Alternatively, the act of forming the insulator layer in between the carrier substrate body and the collector region may comprise the further act of performing a wafer bonding process. Here, the act of forming the insulator layer in between the carrier substrate body and the collector region may comprise bonding a first wafer over a second wafer which has at least part of the insulator layer.

It is to be understood that the above is merely a description of preferred embodiments of the invention and that various changes, alterations, and variations may be made without departing from the true spirit and scope of the invention as set for in the appended claims. For example, although the TTM is described as a three-leaded device, it may actually have three or more leads. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A magnetic storage device, comprising:
    a slider body made of a semiconductor material, the slider body including a top semiconductor layer and a bottom semiconductor layer;
    a magnetic head carried on the slider body;
    a read head portion of the magnetic head which includes a three terminal magnetic sensor having three terminals;
    the three terminal magnetic sensor being configured for reading, at a magnetic field sensing plane, magnetic signals from magnetic media of the magnetic storage device;
    the three terminal magnetic sensor including:
        a base region;
        an emitter region;
        a collector region which is the top semiconductor layer of the slider body and composed of the semiconductor material of the slider body;
        the base region comprising magnetic materials and being formed in between the emitter and the collector region;
        a base lead in contact with the magnetic materials of the base region;
        an emitter lead in contact with the emitter region;
        a collector lead in contact with the top semiconductor layer of the slider body;
        the base lead, the emitter lead, and the collector lead forming the three terminals of the three terminal magnetic sensor;
        a first barrier region formed between the base region and the emitter region;

a second barrier region formed between the base region and the collector region; and an insulator layer which separates the top semiconductor layer of the slider body from the bottom semiconductor layer of the slider body, for electrically isolating at the magnetic field sensing plane the collector region from the bottom semiconductor layer of the slider body, so as to effectively eliminate a capacitance otherwise present between the collector region and the magnetic media.

2. The magnetic storage device of claim 1, wherein the slider body comprises a wafer-bonded structure having a first slider body portion that is wafer-bonded together with a second slider body portion, and the insulator layer is an oxidized surface of the first slider body portion that is wafer-bonded together with the second slider body portion, where the oxidized surface faces the second slider body portion.

3. The magnetic storage device of claim 1, wherein the slider body has dimensions of less than 1 mm$^3$ and a fly height of no greater than 3 nanometers with respect to the magnetic media.

4. The magnetic storage device of claim 1, wherein the three terminal magnetic sensor is for reading magnetic signals from magnetic media of the magnetic storage device at operating frequencies of 1 Gigahertz or greater.

5. The magnetic storage device of claim 1, wherein the emitter region is configured to receive electrons which travel perpendicular to the planes of the base, the emitter, and the collector regions.

6. The magnetic storage device of claim 1, wherein the insulator layer comprises silicon-dioxide.

7. The magnetic storage device of claim 1, wherein the insulator layer comprises an oxide.

8. The magnetic storage device of claim 1, further comprising a disk drive.

9. The magnetic storage device of claim 1, wherein the three terminal magnetic sensor comprises a magnetic tunnel junction structure.

10. The magnetic storage device of claim 1, wherein the three terminal magnetic sensor comprises a double tunnel structure.

* * * * *